(12) United States Patent
Voss et al.

(10) Patent No.: US 10,530,362 B2
(45) Date of Patent: Jan. 7, 2020

(54) TOTAL INTERNAL REFLECTION PHOTOCONDUCTIVE SWITCH

(71) Applicants: Lars Voss, Livermore, CA (US); Mihail Bora, Livermore, CA (US); Adam Conway, Livermore, CA (US); Paulius Vytautas Grivickas, Livermore, CA (US)

(72) Inventors: Lars Voss, Livermore, CA (US); Mihail Bora, Livermore, CA (US); Adam Conway, Livermore, CA (US); Paulius Vytautas Grivickas, Livermore, CA (US)

(73) Assignee: Lawrence Livermore National Security, LLC, Livermroe, CA (US)

( * ) Notice: Subject to any disclaimer, the term of this patent is extended or adjusted under 35 U.S.C. 154(b) by 55 days.

(21) Appl. No.: 15/806,243

(22) Filed: Nov. 7, 2017

(65) Prior Publication Data

US 2018/0131370 A1 May 10, 2018

Related U.S. Application Data

(60) Provisional application No. 62/418,673, filed on Nov. 7, 2016.

(51) Int. Cl.
*H03K 17/78* (2006.01)
*H01L 31/10* (2006.01)

(52) U.S. Cl.
CPC ............. *H03K 17/78* (2013.01); *H01L 31/10* (2013.01)

(58) Field of Classification Search
CPC . H03K 17/78; H01L 31/0224; H01L 31/0352; H01L 31/028; H01L 31/02327; H01L 31/09; H01L 31/10; Y02E 10/547
See application file for complete search history.

(56) References Cited

U.S. PATENT DOCUMENTS

| 10,181,544 B2* | 1/2019 | Nelson | H01L 31/09 |
| 2015/0187970 A1* | 7/2015 | Curry | H01L 31/03044 |
| | | | 250/552 |

OTHER PUBLICATIONS

Clevenison, et al., "Broadband Magnetometry and temperature sensing with a light-trapping diamond waveguide" Nature Physics, vol. 11, May 2015.

* cited by examiner

*Primary Examiner* — Tony Ko
(74) *Attorney, Agent, or Firm* — James S. Tak

(57) ABSTRACT

A total internal reflection photoconductive switch and method of activating such a switch, where the switch includes a pair of electrodes on opposite sides of a photoconductive material having a substantially-rectangular prism geometry. The substantially-rectangular prism geometry includes four edge facets, two opposing electrode-connection facets separated by the edge facets, and at least one input facet located at a corner of the substantially-rectangular prism geometry that is positioned between two edge facets and the two electrode-connection facets, for receiving light therethrough into the photoconductive material at angles supporting total internal reflection.

13 Claims, 8 Drawing Sheets

TOTAL INTERNAL REFLECTION PHOTOCONDUCTIVE SWITCH

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

Photoconductive semiconductor switches (PCSS) are known, and generally operate by blocking current while in the off state to maintain voltage in the circuit due to its high resistance, and becoming optically excited while in the on state to become conductive and transfer voltage into a load. PCSS are required for a variety of applications including for example grid switching, power switching, RF generation, and others. Prior work has demonstrated photoconductive switching using Si, GaAs, SiC, and other materials, and various methods of illuminating photoconductive switch material to activate conduction are known.

For example, one known photoconductive switch design uses an edge illumination scheme in an effort to increase optical absorption by lengthening the optical path. This illumination method introduces light through a side (i.e. an "edge facet") of a rectangular prism-shaped photoconductive material having a generally at profile, with two dimensions (e.g. x and y dimensions) substantially greater than the third dimension (e.g. z dimension), wherein four of the six facets are considered edge facets defined in part by the smaller third dimension and the two opposing wider facets are characterized as electrode connection/contact surfaces where electrodes typically connect to the photoconductive material. While the long path length of such edge illuminated designs gives moderate light utilization capability, most of the light is known to still escape out through the back side of the switch. Furthermore, edge illuminated switches have been known to exhibit surface flashover, field build up at the inactive regions, and other problems. In particular, low breakdown voltage in the on-state is considered to be caused by charge build up at the junction between the metal electrode, the air and the photoconductive material, referred to as the "triple point," which leads to enhancement of the electric field. The field enhancement occurs in the switch on-state when current is generated in the entirety of the substrate which forces the current in the region outside of the metal contact to concentrate at the electrode edge, resulting in field enhancement and reduced breakdown voltage.

Another known photoconductive switch design uses axial illumination, whereby light is introduced normal to an electrode contact-surface of a rectangular prism-shaped photoconductive material so that all the carriers are confined within the metal electrode. While this axially-pumped switch design enabled very high voltage due to the minimization of triple junction field enhancements, it typically has very low light utilization on the order of 1% utilization of the light due to the low absorption coefficient and short optical path length. Consequently, this design has required very high laser fluence for operation, which in turn can degrade the metal contacts on the top and bottom of the switch and can damage the fiber optics delivering the light to the switch.

Bulk excitation of the switch with sub-bandgap light has the advantage of thicker (~1 mm) devices that can hold voltages in excess of 30 kV, and uniform generation of charge carriers over entire thickness, necessary to turn the switch "on". However, uniform conductivity in the bulk has typically come at the cost of low absorbance, and therefore a photoconductive switch with improve optical absorption is still needed.

SUMMARY

In one example implementation, the present invention includes a total internal reflection photoconductive switch comprising: a photoconductive material having a substantially-rectangular prism geometry with four edge facets each normal to an adjacent edge facet, two opposing electrode-connection facets separated by the edge facets, and at least one input facet located at a corner of the substantially-rectangular prism geometry interposed between two edge facets and the two electrode-connection facets for receiving light therethrough into the photoconductive material at angles supporting total internal reflection; and opposing electrodes connected to the two electrode connection facets for applying voltage across the photoconductive material.

In another example implementation, the present invention includes a method of activating a photoconductive switch to conduct, comprising; providing a photoconductive switch comprising: a photoconductive material having a substantially-rectanglar prism geometry with four edge facets each normal to an adjacent edge facet, two opposing electrode-connection facets separated by the edge facts, and at least one input facet located at a corner of the substantially—rectangular prism geometry interposed between two edge facets and the two electrode-connection facets for receiving light therethrough into the photoconductive material at angles supporting total internal reflection; and opposing electrodes connected to the two electrode connection facets for applying voltage across the photoconductive material; and directing light into the photoconductive material through the input facet.

These and other implementations and various features and operations are described in greater detail in the drawings, the description and the claims.

The present invention is generally directed to a photoconductive switch activated by total internal reflection (TIR), and a method of activating a photoconductive switch by TIR, in particular, the photoconductive switch of the present invention comprises an optically-activated photoconductive material, e.g. a wide bandgap semiconductor such as for example SiC, GaN, GaAs, diamond, etc., having a flat, substantially-rectangular prism geometry with two opposing wide-area electrode-connection facets, four edge facets each oriented normal/orthogonal to an adjacent edge facet and separating the two electrode-connection facets, and at least one input facet (also characterized as a "notch") located at a corner of the substantially-rectangular prism geometry, i.e. where orthogonal edge facets intersect or would otherwise intersect if not for the notch. In particular, the input facet is interposed between two edge facets and the two electrode-connection facets, for receiving light therethrough into the photoconductive material at angles which trap light and thereby support total internal reflection. Additionally, two opposing electrodes are operably connected to the electrode-connection facets, for applying voltage from a voltage source across the photoconductive material. Furthermore, it is appreciated that the TIR photoconductive switch of the present invention may also include cladding (not shown) surrounding the edge facets and any exposed areas of the electrode-connection facets, by for example depositing a reflective coating or immersing the photoconductive material and switch in a high voltage fluid. And a light source of appropriate energy to optically generate current may also be provided to introduce light through the input facet.

The input facet(s) operates as an aperture for light to enter the photoconductive material. In various embodiments of the present invention, the input facet may be either a planar surface or a concave surface. In the case of a concave surface, the input facet may be a curved surface such as a cylindrical surface or a spherical one. In the case of a planar surface, the input facet may be angled 45 degrees from an adjacent edge facet, or at any other angle between 0 and 90 degrees relative to the edge facets, so that light introduced through the input facet undergoes total internal reflection to enable maximum light utilization within the photoconductive material. Regarding the light beam angle of incidence, light may also be introduced at an angle of between 0 and 90 degrees (including 90 degrees) from the input facet plane in a configuration for supporting total internal reflection. While a single input facet is described herein and in the figures, additional notches/input facets may be similarly provided at other corners of the substantially-rectangular prism geometry to operate as additional apertures for receiving light therethrough into the photoconductive material at angles supporting total internal reflection. It is notable that while only one notch or input facet 20 is shown, it is appreciated that additional notches/input facets may be similarly provided at other corners of the substantially-rectangular prism geometry to operate as additional apertures for receiving light therethrough into the photoconductive material at angles supporting total internal reflection. And light exiting through the input facet aperture can be minimized by decreasing the area of the input facet relative to the total surface area of the photoconductive material, e.g. wherein the ratio of the input facet surface area to the total surface area of the photoconductive material is less than 0.5.

The method and approach of the present invention operates to improve overall absorbance and light utilization without modifying material composition or properties. The concept of the present invention is analogous to the idealized 'cavity with a hole' black body model where near unity absorbance is achieved for a small aperture in a large cavity bounded by walls opaque to radiation. The cavity is implemented as the substantially-rectangular prism semiconductor substrate with a polished input facet (or notch) at one of the corners serving as an entrance aperture for photoexcitation. The cavity walls (semiconductor facets) are rendered opaque to incident radiation from within the material by virtue of total internal. reflection with suitable choices of substrate geometry and angular distribution of incident light. This design exploits unity total internal reflection coefficient for light incident on substrate facets at angles above the critical angle (e.g. ~22 degrees for SiC). The incident light profile is chosen such that the total internal condition holds for any side of the photoconductive material substrate and after any specular reflection, thereby improving absorbed light fraction and uniformity. The TIR photoconductive switch of the present invention, therefore, is a multi-pass optical cavity with light reflecting off the walls until it is absorbed in the semiconductor volume or at interfaces. By incorporating TIR to trap light in the photoconductive material, the total internal reflection photoconductive switch of the present invention is simultaneously capable of making efficient use of incident light (i.e. improve device quantum efficiency, defined as number of generated charge carriers per incident photon) while maintaining a high stand-off voltage. The high stand-off voltage is made possible by the use of sub-band gap light with relatively low absorption coefficient. This enables uniform excitation of the bulk of switch, which allows for the use of relatively large thickness.

Competing optical dissipation mechanisms such as light exiting through the input facet aperture and absorption within device metallic contacts can be minimized by decreasing the size of the input facet, optimization of illumination beam divergence and using highly reflective materials (silver and aluminum) for electrode contacts and cladding.

Furthermore, in one example embodiment, the TIR-based photoconductive switch of the present invention may use diamond as the photoconductive material, to take advantage of the excellent intrinsic properties of semiconducting diamond uniquely suited for photoconductive switching applications, and is a material that requires less light per unit power. Diamond possesses higher electric field breakdown, bandgap, charge carrier mobility, and thermal conductivity compared to silicon carbide. Therefore, total internal reflection diamond switch device may be used for high switched power applications at GHz frequencies with high quantum efficiencies (e.g. in excess of 50%).

Additional features of the total internal reflection photoconductive switch may include the following.

In one example embodiment, the present invention may overcome the issue of charge buildup by extending the contacts of the electrodes all the way to the edge of the switch, where the surface field will he managed by dielectric coatings, high breakdown fluids and/or epoxy, along with a shaped copper electrode that will act as a field plate. Extending contacts to the sides increases the active volume of the device, decreases current density thus allowing fur higher total current switched per device and enables higher operating voltage by correcting previous issue of charge buildup at the edge. The breakdown strength of 4H-SiC is 2.5 MV/cm, allowing a 1 mm thick part to withstand 250 kV. This value is >10×higher than the switch operating voltage, consequently even with enhanced breakdown along the edge this device architecture should withstand the desired voltage.

Other example embodiments may incorporate and utilize highly reflective electrodes or contracts may be used to maximize reflectivity, providing highly polished optical quality surfaces on all four edge facets and the input facet; depositing an anti-reflective coating on the input facet to improve light transmission; using coatings and other methods to improve breakdown strength of the polished edge facets; and doping at edge terminations to manage and mitigate field enhancements. In this regard, embodiments may be include one or more of the following: wherein at least one of the edge facets of the photoconductive material be surrounded by a volume having a refractive index $n < n_{photoconductive\ material}$; wherein I at least one of the electrode-connection facets of the photoconductive material may be coated with reflective material with reflectivity >50%, and furthermore, the reflective material may be conductive; wherein at least one of the electrode-connection facets of the photoconductive material is coated with a layer with refractive index $n_{layer} < n_{photoconductive\ material}$, which furthermore may be conductive; wherein at least one of the facets of the photoconductive material may be coated with a layer that is transparent to the light, and the transparent layer is surrounded by a third material with $n_{third\ material} < n_{transparent\ layer}$; and wherein at least one of the electrode-connection facets of the photoconductive material may be coated with a grid comprising <100% of the area of the facet.

DETAILED DESCRIPTION

Figure 1:
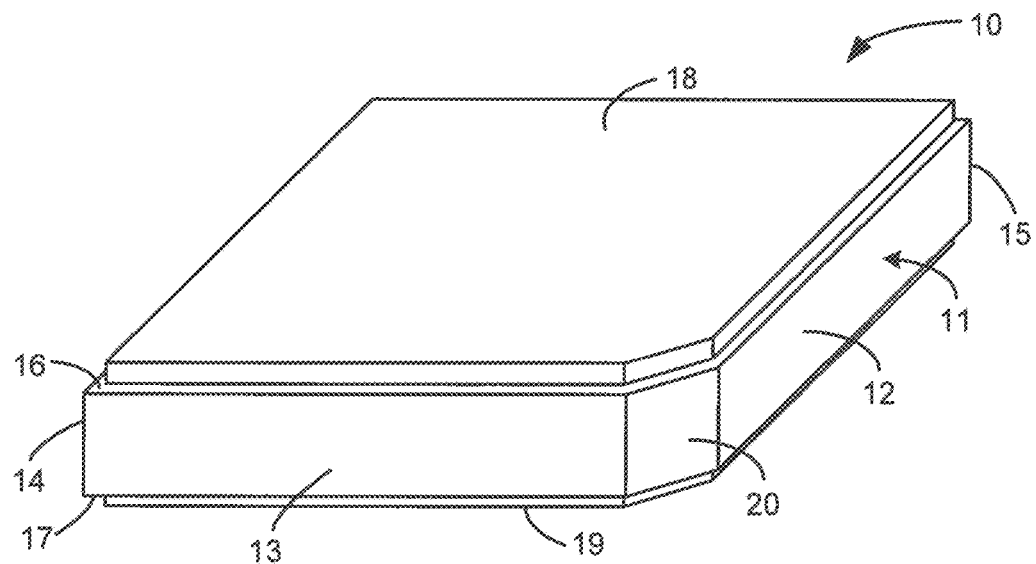
FIG. 1 is a perspective view of an example embodiment of the total internal reflection photoconductive switch of the present invention.

Turning now to the drawings, FIG. 1 shows a perspective view of a first example embodiment of the total internal reflection (TIR) photoconductive switch of the present invention, generally shown at reference character 10, and having a photoconductive material 11 sandwiched between two electrodes 18 and 19. The photoconductive material 11 has a substantially-rectangular prism geometry, with four edge facets 12-15 each normal to an adjacent edge facet, and two opposing electrode-correction facets 16 and 17 separated by the edge facets. While a rectangular prism is understood to have only six facets, the substantially-rectangular prism geometry of the photoconductive material 11 also includes a notch or input facet 20 located at a corner of the substantially-rectangular prism geometry, i.e. where orthogonal edge facets intersect or would otherwise intersect if not for the notch. In particular, the input facet 20 is interposed between two edge facets and the two electrode-connection facets, for receiving light therethrough into the photoconductive material at angles supporting total internal reflection. And the two opposing electrodes 18, 19 are connected to the two electrode-correction facets 16, 17, respectively, for applying voltage across the photoconductive material when connected to a voltage source (not shown).

Figure 2:
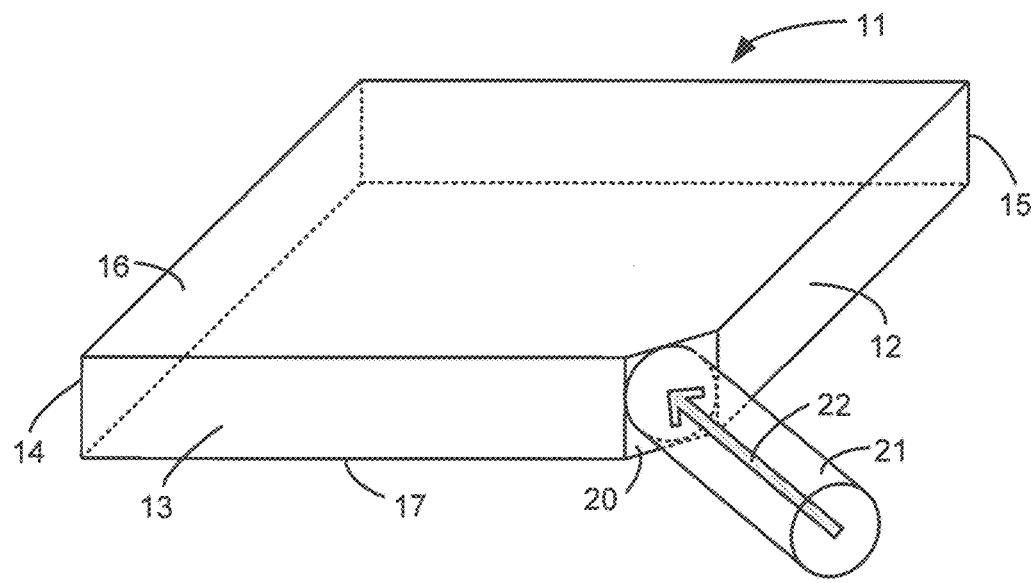
FIG. 2 is a perspective view of the photoconductive material of the TIR photoconductive switch of FIG. 1 with the electrodes removed.
Figure 3:
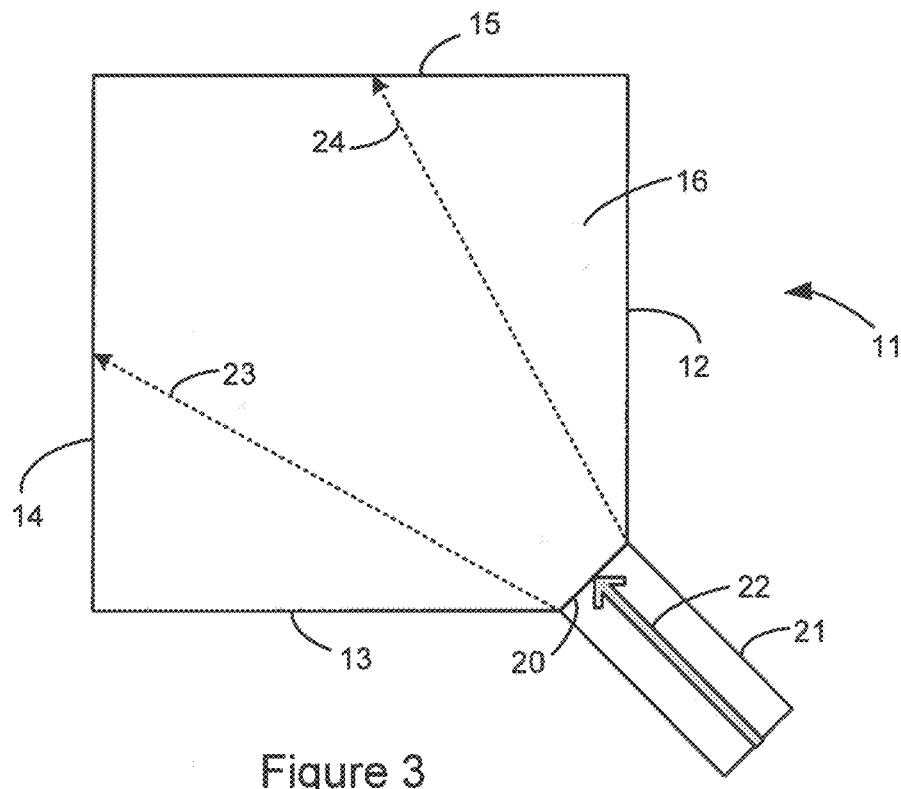
FIG. 3 is a top view of the photoconductive material of FIG. 2.

FIGS. 2 and 3 together show the photoconductive material 11 of FIG. 1 with the electrodes 18 and 19 removed and illustrating the typical configuration of its substantially-rectangular prism geometry, as well as an example mode of optical transport to the input facet 20. The substantially-rectangular prism geometry of the photoconductive material 11 is shown having a generally flat profile, with a length and width substantially greater than its height. In particular, the two electrode-connection surfaces 16, 17 may be characterized as being defined by a length and width, the edge facets 12-15 may be characterized as being defined by a height and one of length and width, and the input facet 20 may be characterized as being defined by height and width, where the length and width are dimensions that are substantially greater than the height. The input facet is also shown having a width and height substantially equal to each other. And as best seen in FIG. 3, the input facet 20 is also angled at 45 degrees with respect to adjacent edge facets 12 and 13, so that light entering the photoconductive material 11 is directed diagonally to an opposite corner of the material. And light, represented by arrow 22, is shown transported to the input facet 20 by a fiber optic 21 from a light source (not shown), and diagonally entering the photoconductive material as a diverging beam represented by rays 23, 24 which are directed to the walls of the opposite edge facets 14 and 15.

Figure 4:
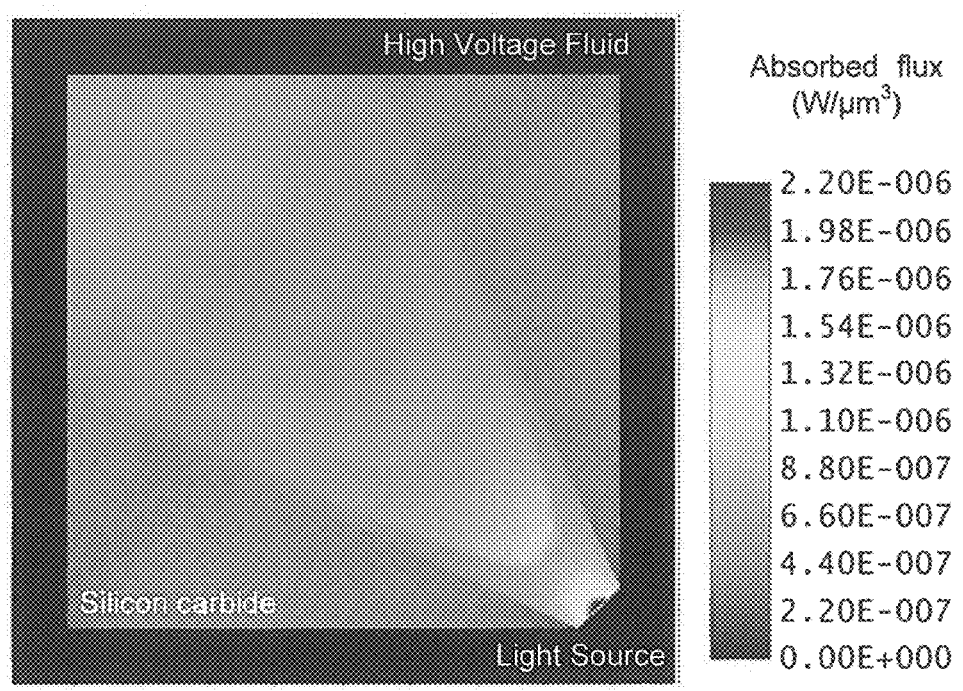
FIG. 4 is an image of a mid-plane cross section of absorbed flux from a ray-tracing numerical simulation of light absorbance in a SiC substrate having an input facet that is a 45 degree planar surface.

FIG. 4 shows an image of a mid-plane cross section of absorbed flux from a ray-tracing numerical simulation of light absorbance in a SiC substrate (extinction coefficient $10^{-2}$ mm$^{-1}$) immersed in high voltage fluid and having a 45 degree input facet. A point light source of total power 1W illuminates the notch aperture from the lower right corner, so that light enters the switch with an angular spread of about 30 degrees (simulating illumination from an optical fiber) in a substantially diagonal direction and reflects multiple times (due to the low absorption coefficient) off the substrate facets, creating a highly uniform profile and increasing the total dissipated optical energy in the photoconductive material, in particular, the mid-plane cross section shows no dissipation in the high voltage fluid, indicative of light trapping in the silicon carbide substrate and the substantial uniformity of absorbed flux.

Figure 5:
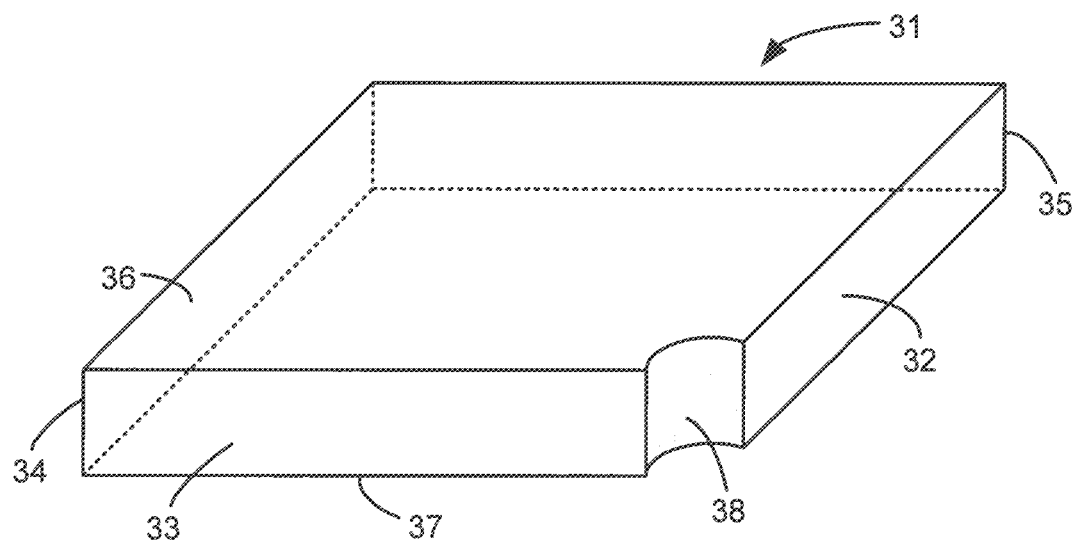
FIG. 5 is a perspective view of a photoconductive material of another example embodiment of the TIR photoconductive switch, having an input facet that is a cylindrical surface.
Figure 6:
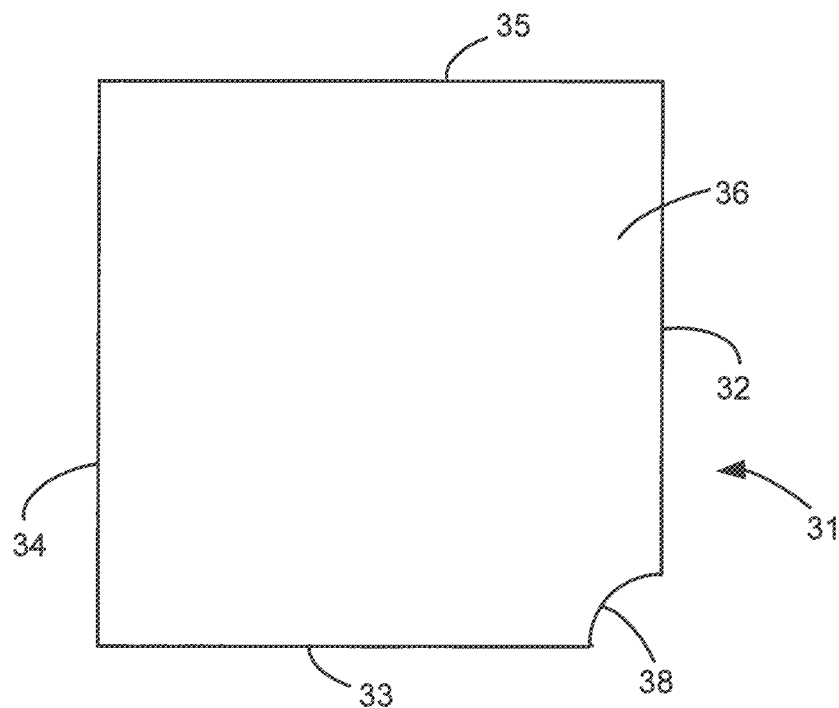
FIG. 6 is a top view of the photoconductive material of FIG. 5.

FIGS. 5 and 6 together show the photoconductive material 31 of another exemplary embodiment of the TIR photoconductive switch of the present invention. Similar to FIGS. 2 and 3, FIGS. 5 and 6 are shown with the electrodes removed from the electrode-connection facets. The material 31 is also shown having a substantially-rectangular prism geometry with opposing electrode-connection facets 36 and 37, edge facets 32-35, and an input facet 38. In particular, the input facet 38 is shown having a concave surface that has a cylindrical configuration, i.e. cylindrical surface. The cylindrical surface is shown oriented such that its cylinder axis (not shown) is normal or orthogonal to the electrode-connection surfaces, so that a light beam entering the cylindrical surface may be directed diagonally into the photoconductive material. The cylindrical or spherical surface acts as a lens to distribute the light more uniformly throughout the switch than a flat notch, i.e. a planar input surface. In particular, the notch/input facet may be cylindrical, such that light is spread in two directions, or spherical such that light is spread in all three directions.

Figure 7:
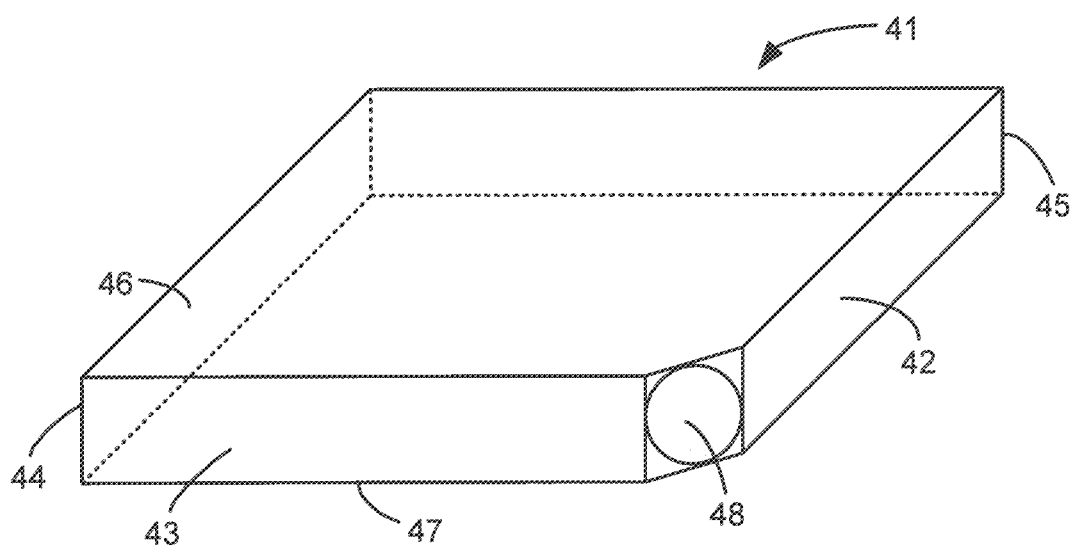
FIG. 7 is a perspective view of a photoconductive material of another example embodiment of the TIR photoconductive switch, having an input facet that is a spherical surface.
Figure 8:
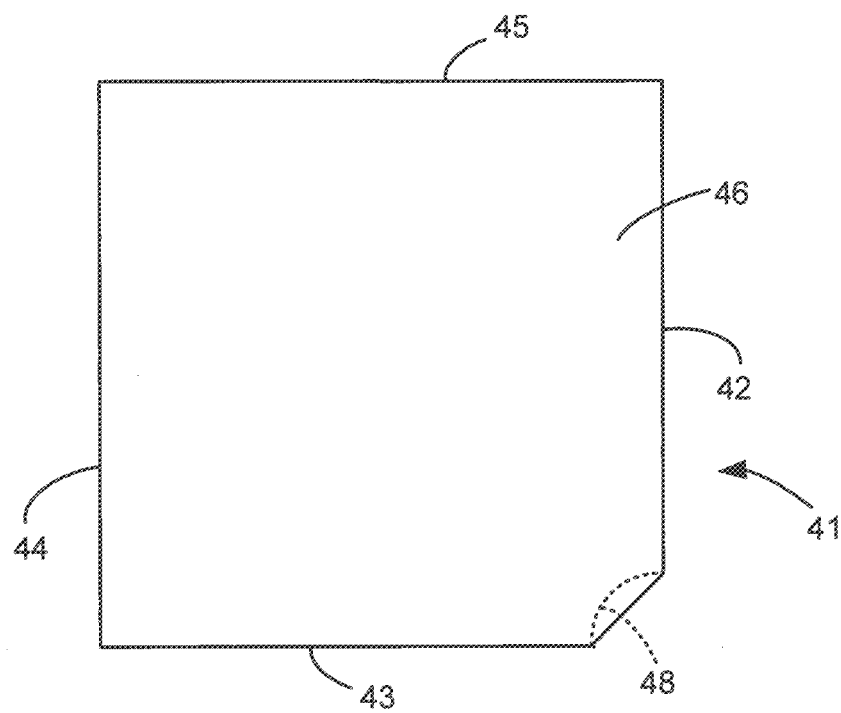
FIG. 8 is a top view of the photoconductive material of FIG. 7.

FIGS. 7 and 8 together show the photoconductive material 51 of another exemplary embodiment of the TIR photoconductive switch of the present invention. Similar to FIGS. 2, 3, and 7, 8, FIGS. 7 and 8 are shown with the electrodes removed from the electrode-connection facets. The material 51 is also shown having a substantially-rectangular prism geometry with opposing electrode-connection facets 46 and 47, edge facets 42-45, and an input facet 48. In particular, the input facet 48 is shown having a concave surface that has a spherical configuration, i.e. spherical surface.

Figure 9:
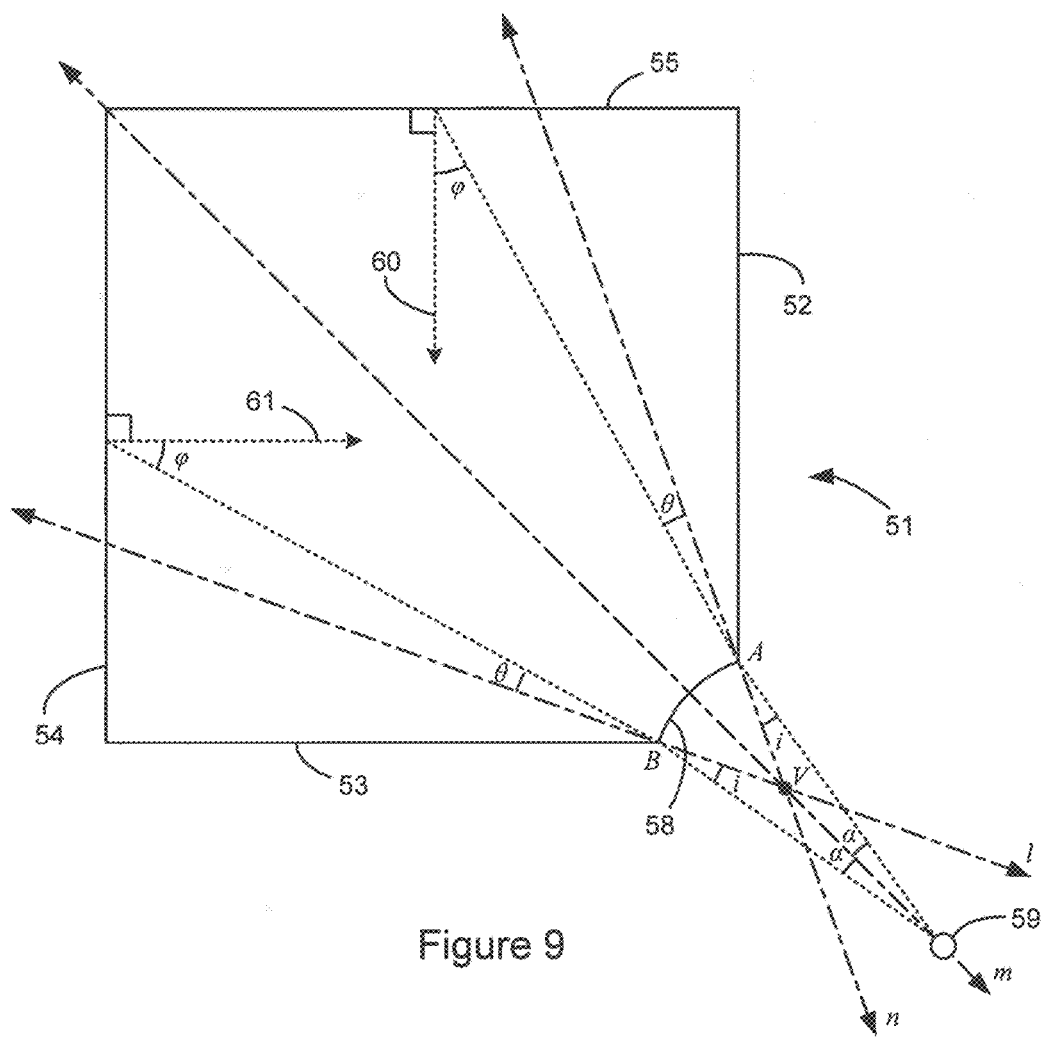
FIG. 9 is a schematic plan view of an example photoconductive material. having an input facet that is a cylindrical surface and generally illustrating the parameters for tailoring a divergent beam of light to support total internal reflection.

FIG. 9 shows a schematic plan view of an example photoconductive material 51 having an input facet 58 that is a cylindrical surface and generally illustrating the parameters for tailoring and optimizing a divergent beam of light to support total internal reflection; although the absorption coefficient is low, the light bounces multiple times within the switch creating a highly uniform profile. The photoconductive material is also shown having edge facets 52-55, with edge facet 52 shown joined to input facet 58 along a line represented by point A, and with edge facet 53 shown jointed to input facet 58 along a line represented by point B. It is appreciated that the distance between A and B represents the width of the input facet. In FIG. 9, the following definitions apply: i, is the incidence angle of the ray on the curved window; θ, is the angle of the refracted ray in the substrate; φ, is the minimum angle from normal for total internal reflection; r, (shown in FIGS. 11, 12) is the notch radius of curvature; x, is the distance of source to the input facet; h, is the height of substrate; and a is the angular spread of light.

Furthermore, the cylindrical surface 58 shown in FIG. 9 is defined by a radius of curvature having a vertex represented by point V. In this regard, lines n and l, while shown intersecting points A and B, respectively, generally represent the orthogonal lines to any point on the cylindrical surface. It is appreciated that the orthogonal lines n and l passing through points A and B represent the limiting case, where the reflection angle from the first reflection off the opposite wall of the edge fact will be the smallest.

Figure 10:
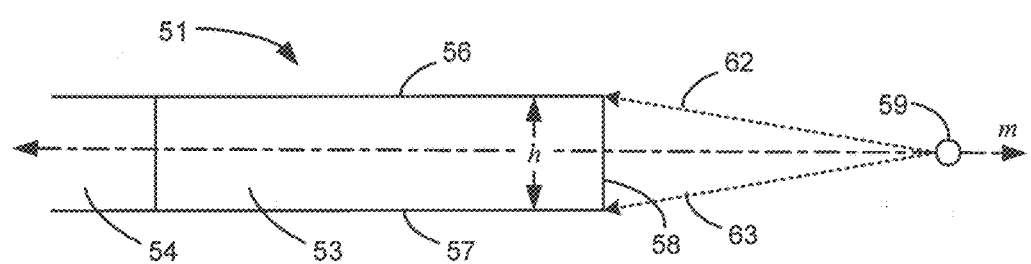
FIG. 10 is a schematic side view of the photoconductive material of FIG. 9 illustrating the beam cone that having a width at the input facet that is equal to the height of the input facet of the photoconductive material.

And a point source of light is schematically represented at 59 in FIG. 9 and located along a diagonal center line in passing through the vertex V and an opposite corner of the photoconductive material (intersection of edge facets 54 and 55). A divergent beam of light is shown having angular spread a and incident on the cylindrically (or spherically) shaped input facet 58. The source is positioned along the diagonal line in and in line with the vertex V and is intended to increase the uniformity of absorption of light within the photoconductive switch. The radius of curvature of the input facet surface and the distance of the source from the input surface, x, may be selected so that >90% of incident light is incident on the curved notch at an angle of incidence, i, that when combined with the refracted angle of the light, θ, within the substrate results in subsequent angles of incidence which are higher than the critical angle required for total internal reflection, φ. The angle for total internal reflection is defined by the critical angle, φ, such that φ=arcsin($n_2/n_1$), where $n_1$ is the refractive index of the photoconductive material 51 and $n_2$ is the refractive index of the surrounding medium/volume. The distance of the source from the input facet, x, may be chosen such that the height of the beam (see FIG. 10) at the curved input facet is roughly equal to the height and width of the input facet. And FIG. 10 is a schematic side view of the photoconductive material of FIG. 9 illustrating the beam cone, represented by rays 62 and 63, produced by the point source of the light 59, and having a height at the input facet that is equal to the height, h, of the input facet of the photoconductive material. It is notable that the wavelength of the light may be chosen to have an absorption coefficient associated with an extinction length in the photoconductive material that is >2× longer than the shortest edge facet of the photoconductive material.

Figure 11:
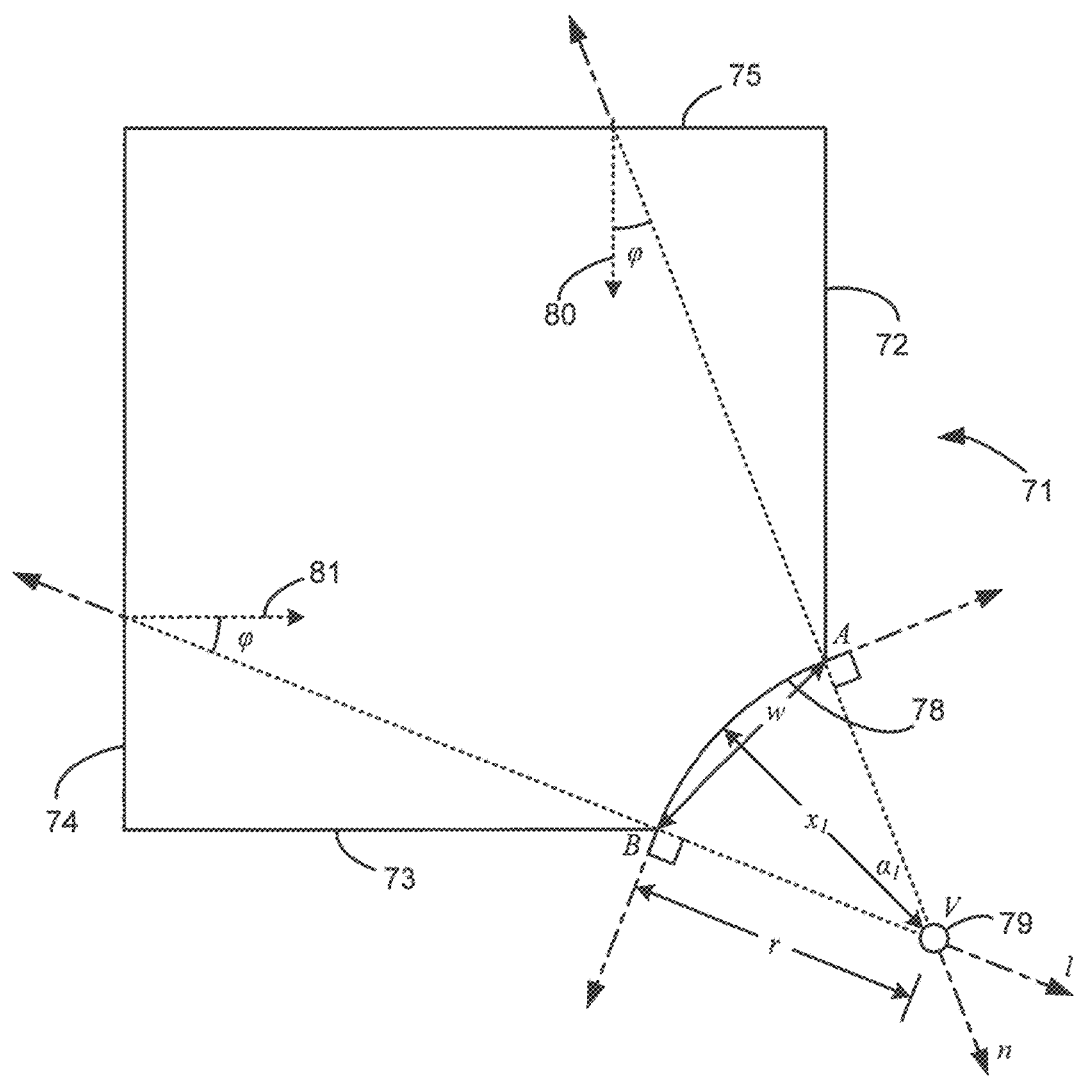
FIG. 11 is a schematic plan view of an example photoconductive material having an input facet that is a cylindrical surface and particularly illustrating the use of a point source of light located at the radius of curvature vertex of the cylindrical surface.

FIG. 11 is a schematic plan view of an example photoconductive material 71 having an input facet 78 that is a cylindrical surface and particularly illustrating the use of a point source of light 79 located at the vertex V of the radius of curvature of the cylindrical surface. Because the source is located at the vertex V, the distance of the source to the curved input surface, $x_1$, is equal to the radius of curvature, r. Because of this, when a light beam with angular spread $α_1$ passes through the input facet at the limits of points A and B, it does so without refracting, and the first reflection angle is thus the lowest value for any first angle of reflection, and thus helps establish the value for the critical angle φ. For example, in the case of in air and a point source illumination, the total internal reflection angle φ for a refractive index of 2.7 is approximately 21.74 degrees, and the angular spread α, calculated as the half angle of the emission cone, is 23.26 degrees. Imposing the limiting condition that the width of the beam at the input facet surface is equal to the height of the sample (assumed to be 1 mm for illustration purposes) the distance from source to the facet, also equal to the radius of curvature of the facet is calculated as 1.16 mm.

Figure 12:
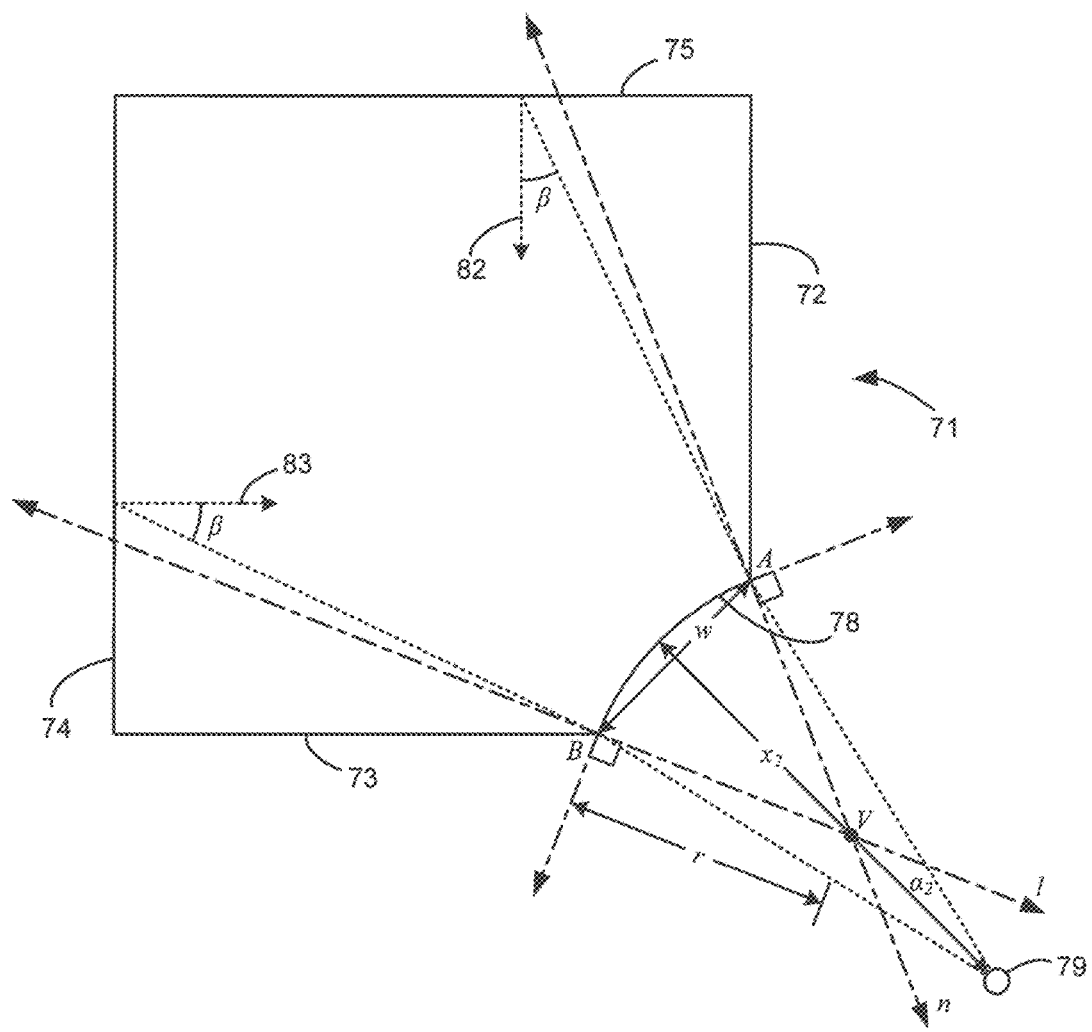
FIG. 12 is a schematic plan view of an example photoconductive material having an input facet that is a cylindrical surface similar to FIG. 11, and particularly illustrating the use of a point source of light located a distance x that is greater than the radius of curvature of the cylindrical surface.

And FIG. 12 is a schematic plan view of an example photoconductive material having an input facet that is a cylindrical surface similar to FIG. 11, and particularly illustrating the use of a point source of light located a distance x that is greater than the radius of curvature of the cylindrical surface. In this illustration, the point source 79 is located further away from the input facet than the vertex V, such that the distance $x_2$ is greater than the radius of curvature r. For a beam represented by rays 82, 83 with an angular spread of $α_1$, and angle of incidence i, and angle of refraction θ, the first reflection off the wall of edge facet 75 will be at an angle β, where β>φ.

Figure 13:
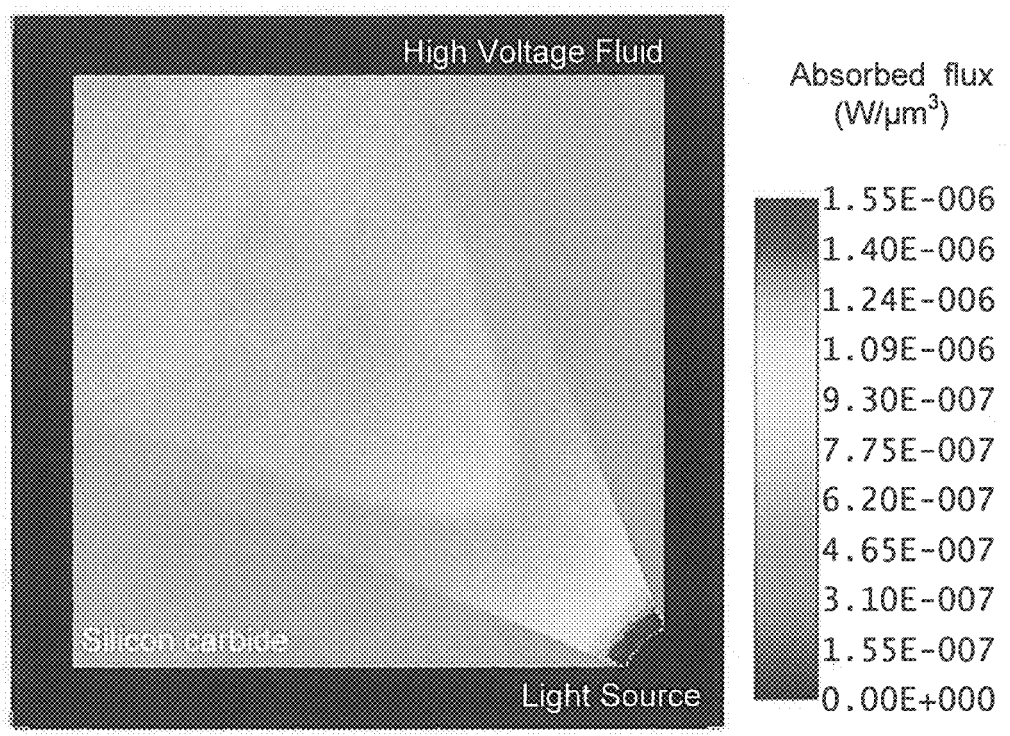
FIG. 13 is an image of a mid-plane cross section of absorbed flux from a ray tracing numerical simulation of light absorbance in a SiC substrate having an input facet that is a cylindrical surface.

FIG. 13 shows an image of a mid-plane cross section of absorbed flux from a ray-tracing numerical simulation of light absorbance in a SiC substrate (extinction coefficient $10^{-2}$ mm$^{-1}$) immersed in high voltage fluid, and having an input facet that is a cylindrical surface. In particular, the mid-plane cross section shows no dissipation in the high voltage fluid, indicative of light trapping in the silicon carbide substrate and the substantial uniformity of absorbed flux, Light from a point source is introduced into the photoconductive material through the cylindrical notch aperture shown at the lower right corner, that acts as a lens to distribute the light more uniformly throughout the switch than a flat notch. The parameters of the notch are chosen to maximize the spreading of light while maintaining total internal reflection within the switch. FIG. 13 shows the improved light distribution compared to the 45 degree planar notch simulation of FIG. 4.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A total internal reflection photoconductive switch comprising:
   a photoconductive material having a substantially-rectangular prism geometry with four edge facets each normal to an adjacent edge facet, two opposing electrode-connection facets separated by the edge facets, and at least one input facet located at a corner of the substantially-rectangular prism geometry interposed between two edge facets and the two electrode-connection facets for receiving light therethrough into the photoconductive material at angles supporting total internal reflection; and
   opposing electrodes connected to the two electrode connection facets for applying voltage across the photoconductive material.

2. The photoconductive switch of claim 1, wherein the input facet is a concave surface.

3. The photoconductive switch of claim 2, wherein the concave surface has a curved configuration of a type selected from a group consisting of cylindrical and spherical.

4. The photoconductive switch of claim 1, wherein the input facet is a planar surface.

5. The photoconductive switch of claim 4, wherein the planar surface is angled 45 degrees to each of the two edge facets it is interposed between.

6. The photoconductive switch of claim 1, wherein the two opposing electrode-connection facets are separated by a distance defined as height, and the input facet has a width substantially equal to the height.

7. The photoconductive switch of claim 1, wherein the ratio of the input facet surface area to the total surface area of the photoconductive material is greater than 0 and less than 0.5.

8. A method of activating a photoconductive switch to conduct, comprising:
   providing a photoconductive switch comprising: a photoconductive material having a substantially-rectangular prism geometry with four edge facets each normal to an adjacent edge facet, two opposing electrode-connection facets separated by the edge facts, and at least one input facet located at a corner of the substantially—rectangular prism geometry interposed between two edge facets and the two electrode-connection facets for receiving light therethrough into the photoconductive material at angles supporting total internal reflection; and opposing electrodes connected to the two electrode connection facets for applying voltage across the photoconductive material; and
   directing light into the photoconductive material through the input facet.

9. The method of claim 8, wherein the input facet is a concave surface.

10. The method of claim 9, wherein the concave surface has a curved configuration of a type selected from a group consisting of cylindrical and spherical.

11. The method of claim 8, wherein the input facet is a planar surface.

12. The method of claim 11, wherein the planar surface is angled 45 degrees to each of the two edge facets it is interposed between.

13. The method of claim 8, wherein the two opposing electrode-connection facets are separated by a distance defined as height, and the input facet has a width substantially equal to the height.

* * * * *